(12) United States Patent
Lee et al.

(10) Patent No.: US 11,195,885 B2
(45) Date of Patent: Dec. 7, 2021

(54) DISPLAY DEVICE

(71) Applicant: SAMSUNG DISPLAY CO., LTD., Yongin-si (KR)

(72) Inventors: Gak Seok Lee, Hwaseong-si (KR); Byung-Chul Kim, Suwon-si (KR); Inok Kim, Osan-si (KR); Jaemin Seong, Suwon-si (KR); Inseok Song, Pocheon-si (KR); Keunchan Oh, Hwaseong-si (KR); Jieun Jang, Suwon-si (KR); Chang-Soon Jang, Seoul (KR); Sun-Kyu Joo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/835,870

(22) Filed: Mar. 31, 2020

(65) Prior Publication Data

US 2020/0388654 A1    Dec. 10, 2020

(30) Foreign Application Priority Data

Jun. 7, 2019    (KR) .................... 10-2019-0067397

(51) Int. Cl.
*H01L 27/00* (2006.01)
*H01L 51/00* (2006.01)
*H01L 27/32* (2006.01)
*H01L 51/52* (2006.01)

(52) U.S. Cl.
CPC ........ *H01L 27/322* (2013.01); *H01L 51/5284* (2013.01)

(58) Field of Classification Search
CPC . H01L 27/322; H01L 27/124; H01L 27/3272; H01L 27/12; H01L 27/3262; H01L 51/5284; H01L 51/5252; H01L 51/56; H01L 51/0024; H01L 51/525
See application file for complete search history.

(56) References Cited

U.S. PATENT DOCUMENTS

| 8,446,346 | B2 | 5/2013 | Jeong et al. | |
|---|---|---|---|---|
| 8,866,384 | B2 * | 10/2014 | Wang | H05B 33/04 313/512 |
| 10,365,509 | B2 | 7/2019 | Jeon et al. | |
| 10,770,515 | B2 * | 9/2020 | Kim | H01L 27/322 |
| 2013/0307407 | A1 * | 11/2013 | Wang | H01L 51/5246 313/512 |

(Continued)

FOREIGN PATENT DOCUMENTS

| KR | 10-1107172 B1 | 1/2012 |
|---|---|---|
| KR | 10-2012-0134812 A | 12/2012 |

(Continued)

*Primary Examiner* — Nikolay K Yushin
(74) *Attorney, Agent, or Firm* — Lewis Roca Rothgerber Christie LLP

(57) ABSTRACT

A display device includes: a first substrate; a second substrate on the first substrate; a pixel between the first substrate and the second substrate and including a pixel area and a non-pixel area around the pixel area; a color filter between the pixel and the second substrate and overlapping with the pixel area; and a plurality of protrusions between the second substrate and the color filter, and each of the protrusions has a width that decreases as a distance from the second substrate increases.

20 Claims, 11 Drawing Sheets

(56) References Cited

U.S. PATENT DOCUMENTS

2017/0242292 A1* 8/2017 Jeon .................. G02F 1/133502
2018/0182814 A1* 6/2018 Kim ...................... H01L 27/322
2018/0267210 A1 9/2018 Takeuchi et al.
2018/0277798 A1 9/2018 Heo et al.

FOREIGN PATENT DOCUMENTS

KR           10-1662229 B1    10/2016
KR      10-2017-0099026 A      8/2017

* cited by examiner

FIG. 8
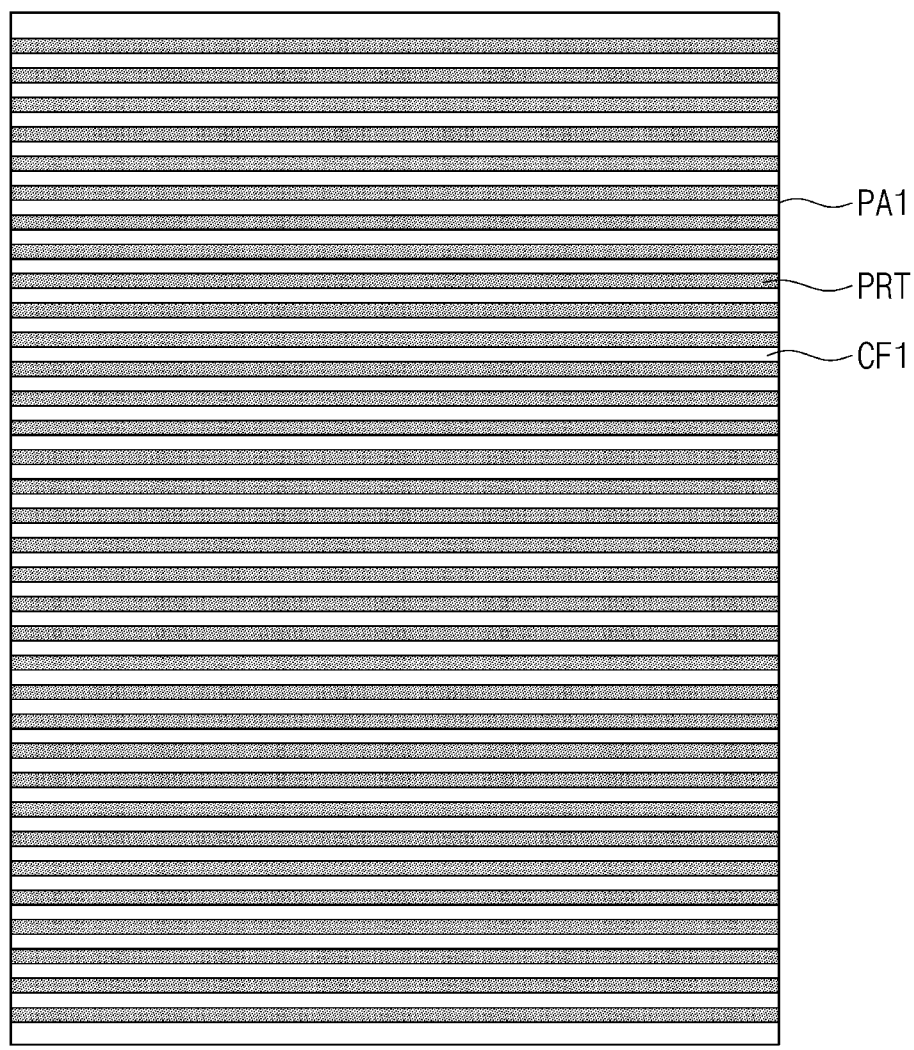
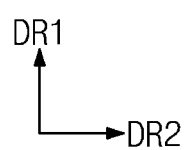

DISPLAY DEVICE

CROSS-REFERENCE TO RELATED APPLICATION

This application claims priority to and the benefit of Korean Patent Application No. 10-2019-0067397, filed on Jun. 7, 2019 in the Korean Intellectual Property Office, the entire content of which is hereby incorporated by reference.

BACKGROUND

1. Field

Aspects of embodiments of the present disclosure relate to a display device.

2. Description of the Related Art

In general, a display device includes a plurality of pixels displaying an image. Each of the pixels includes an image display element disposed in a pixel area and a driving element disposed in a non-pixel area defined around the pixel area. The driving element drives the image display element, and the image display element driven by the driving element generates a light, thereby displaying the image.

In recent years, a display device including light conversion layers is being developed to improve color purity. The light conversion layers are disposed on the pixels and convert a light generated by the pixels to a light having a different wavelength (or a light having a different color). Each of the light conversion layers is disposed to overlap with a corresponding pixel area among the pixel areas. The light generated by the light conversion layers exits to the outside through an upper substrate disposed above the light conversion layers.

Color filters are disposed between the light conversion layers and the upper substrate. The color filters convert the light, which is not converted while passing through the light conversion layers, to the light having colors corresponding to the light conversion layers.

SUMMARY

According to an aspect of embodiments of the present disclosure, a display device is capable of reducing a reflectance of external light.

According to one or more embodiments, a display device includes: a first substrate; a second substrate on the first substrate; a pixel between the first substrate and the second substrate and including a pixel area and a non-pixel area around the pixel area; a color filter between the pixel and the second substrate and overlapping with the pixel area; and a plurality of protrusions between the second substrate and the color filter, and each of the protrusions has a width that decreases as a distance from the second substrate increases.

According to one or more embodiments, a display device includes: a first substrate; a second substrate on the first substrate; a pixel between the first substrate and the second substrate and including a pixel area and a non-pixel area around the pixel area; a color filter between the pixel and the second substrate and overlapping with the pixel area; and a plurality of protrusions between the second substrate and the color filter, and a width of an upper end of each of the protrusions, which faces the second substrate, is larger than a width of a lower end of each of the protrusions.

According to the above, since the protrusions are located between the color filters and the second substrate and the width of the protrusions decreases in a direction away from the second substrate, the refractive index may be gradually changed in the direction away from the second substrate from the boundary between the second substrate and the color filters by the protrusions. Thus, the reflectivity of the external light traveling to the color filter from the outside through the second substrate may be reduced.

BRIEF DESCRIPTION OF THE DRAWINGS

The above and other aspects of the present disclosure will become readily apparent by reference to the following detailed description when considered in conjunction with the accompanying drawings, wherein:

FIGS. 6, 7, and 8 are views showing various arrangements of protrusions shown in FIG. 4;

DETAILED DESCRIPTION

Figure 1:
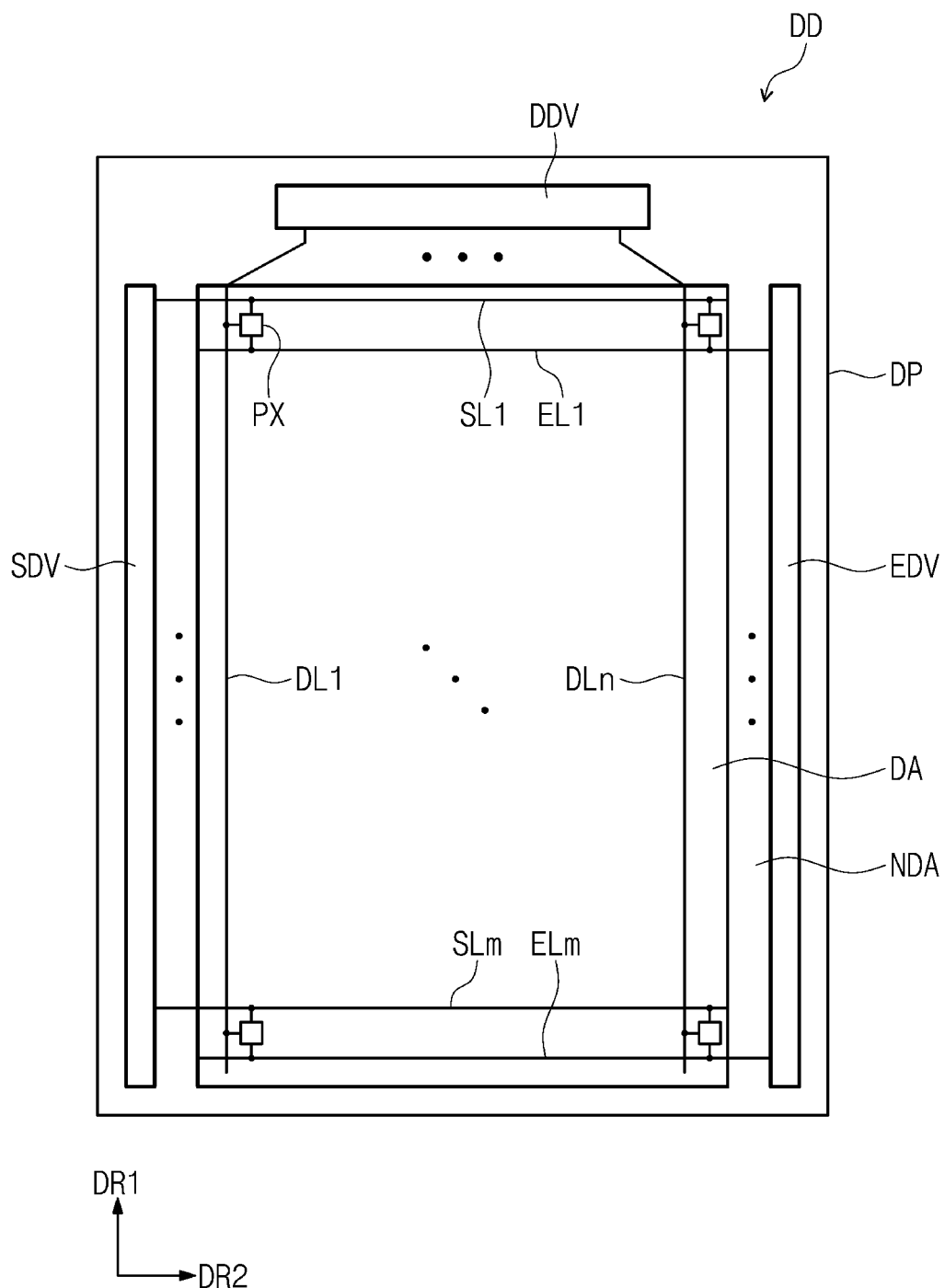
FIG. 1 is a plan view showing a display device according to an embodiment of the present disclosure.

In the present disclosure, it is to be understood that when an element or layer is referred to as being "on," "connected to," or "coupled to" another element or layer, it may be directly on, connected, or coupled to the other element or layer, or one or more intervening elements or layers may be present.

Like numerals refer to like elements throughout. In the drawings, the thickness, ratio, and dimensions of components may be exaggerated for ease of description of the technical content.

As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a "second" element, component, region, layer, or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

It is to be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Herein, the present invention will be explained in further detail with reference to the accompanying drawings, in which various embodiments are shown. The inventive concepts may, however, be embodied in many different forms, and should not be construed as limited to the embodiments set forth herein.

FIG. 1 is a plan view showing a display device DD according to an embodiment of the present disclosure.

Referring to FIG. 1, the display device DD includes a display panel DP, a scan driver SDV, a data driver DDV, and an emission driver EDV.

The display panel DP according to an embodiment of the present disclosure may be a light emitting type display panel, but embodiments of the present disclosure are not particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Herein, the organic light emitting display panel will be described as a representative example of the display panel DP.

In an embodiment, the display panel DP may have a rectangular shape defined by long sides in a first direction DR1 and short sides in a second direction DR2. The display panel DP may include a display area DA and a non-display area NDA around (e.g., surrounding) the display area DA.

The display panel DP includes a plurality of pixels PX, a plurality of scan lines SL1 to SLm, a plurality of data lines DL1 to DLn, and a plurality of emission lines EL1 to Elm, where each of "m" and "n" is a natural number. The pixels PX are arranged in the display area DA and connected to the scan lines SL1 to SLm, the data lines DL1 to DLn, and the emission lines EL1 to ELm.

The scan driver SDV, the data driver DDV, and the emission driver EDV may be disposed in the non-display area NDA. In an embodiment, the scan driver SDV and the emission driver EDV may be disposed adjacent to the long sides of the display panel DP, respectively.

The data driver DDV may be manufactured in the form of an integrated circuit chip and may be disposed adjacent to a short side among the short sides of the display panel DP; however, embodiments of the present disclosure are not limited thereto or thereby. For example, the data driver DDV may be mounted on a flexible circuit board (not shown), and then the flexible circuit board may be connected to the display panel DP. The data driver DDV may be connected to the display panel DP via the flexible circuit board.

The scan lines SL1 to SLm may extend in the second direction DR2 and may be connected to the scan driver SDV. The data lines DL1 to DLn may extend in the first direction DR1 and may be connected to the data driver DDV. The emission lines EL1 to ELm may extend in the second direction DR2 and may be connected to the emission driver EDV.

The scan driver SDV may generate a plurality of scan signals and may apply the scan signals to the pixels PX via the scan lines SL1 to SLm. The scan signals may be sequentially applied to the pixels PX. The data driver DDV may generate a plurality of data voltages, and the data voltages may be applied to the pixels PX via the data lines DL1 to DLn. The emission driver EDV may generate a plurality of emission signals, and the emission signals may be applied to the pixels PX via the emission lines EL1 to ELm.

Although not shown in figures, the display device DD may include a timing controller (not shown) to control operations of the scan driver SDV, the data driver DDV, and the emission driver EDV. The timing controller may generate a scan control signal, a data control signal, and an emission control signal in response to control signals applied thereto from the outside. The timing controller may receive image signals, convert a data format of the image signals to be suitable for an interface between the data driver DDV and the timing controller, and apply the converted image signals to the data driver DDV.

The scan driver SDV may generate the scan signals in response to the scan control signal, and the emission driver EDV may generate the emission signal in response to the emission control signal. The data driver DDV may receive the image signals whose data format is converted and may generate the data voltages corresponding to the image signals in response to the data control signal.

The pixels PX may receive the data voltages in response to the scan signals. The pixels PX emit light corresponding to the data voltages in response to the emission signals to display the image. A time during which the pixels PX emit the light may be controlled by the emission signals.

Figure 2:
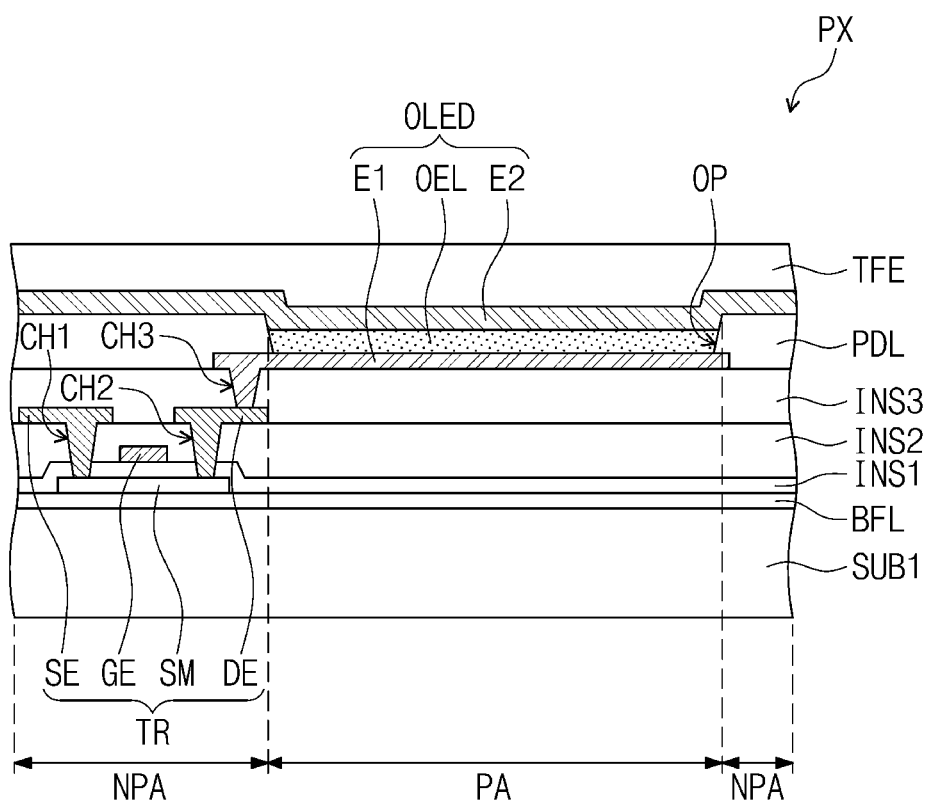
FIG. 2 is a cross-sectional view schematically showing a configuration of a pixel of the display device shown in FIG. 1.

FIG. 2 is a cross-sectional view schematically showing a configuration of a pixel PX of the display device DD shown in FIG. 1.

Referring to FIG. 2, the pixel PX may be disposed on a first substrate SUB1. In an embodiment, the pixel PX may include a light emitting element OLED and a transistor TR connected to the light emitting element OLED. The light emitting element OLED may be an organic light emitting element. The light emitting element OLED may include a first electrode E1, a second electrode E2, and an organic light emitting layer OEL disposed between the first electrode E1 and the second electrode E2.

In an embodiment, the first electrode E1 may be an anode electrode, and the second electrode E2 may be a cathode electrode. The first electrode E1 may be referred to as a "pixel electrode," and the second electrode E2 may be referred to as a "common electrode."

The pixel PX may include a pixel area PA and a non-pixel area NPA around the pixel area PA. The light emitting element OLED may be disposed in the pixel area PA, and the transistor TR may be disposed in the non-pixel area NPA.

The transistor TR and the light emitting element OLED may be disposed on the first substrate SUB1. In an embodiment, the first substrate SUB1 may be a transparent insulating substrate made of glass or plastic. A buffer layer BFL may be disposed on the first substrate SUB1, and the buffer layer BFL may include an inorganic material.

A semiconductor layer SM of the transistor TR may be disposed on the buffer layer BFL. The semiconductor layer SM may include an inorganic semiconductor, such as amorphous silicon or polysilicon, or an organic semiconductor. In an embodiment, the semiconductor layer SM may include an oxide semiconductor. Although not shown in figures, the semiconductor layer SM may include a source area, a drain area, and a channel area defined between the source area and the drain area.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to overlap with the semiconductor layer SM. The gate electrode GE may be disposed to overlap with the channel area of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to the source area of the semiconductor layer SM via a first contact hole CH1 defined through the first insulating layer INS1 and the second insulating layer INS2. The drain electrode DE may be connected to the drain area of the semiconductor layer SM via a second contact hole CH2 defined through the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be a planarization layer to provide a flat upper surface and may include an organic material.

The first electrode E1 may be disposed on the third insulating layer INS3. The first electrode E1 may be connected to the drain electrode DE of the transistor TR via a third contact hole CH3 defined through the third insulating layer INS3.

A pixel definition layer PDL may be disposed on the first electrode E1 and the third insulating layer INS3 to expose a portion (e.g., a predetermined portion) of the first electrode E1. The pixel definition layer PDL may be provided with an opening OP defined therethrough to expose the portion (e.g., predetermined portion) of the first electrode E1.

The organic light emitting layer OEL may be disposed on the first electrode E1 in the opening OP. The organic light emitting layer OEL may include a low-molecular organic material or a high-molecular organic material. In an embodiment of the present disclosure, the organic light emitting layer OEL may generate a first light having a blue color.

The second electrode E2 may be disposed on the pixel definition layer PDL and the organic light emitting layer OEL. A thin film encapsulation layer TFE may be disposed on the second electrode E2 to cover the light emitting element OLED.

In an embodiment, a first voltage may be applied to the first electrode E1, and a second voltage having a voltage level lower than that of the first voltage may be applied to the second electrode E2. A hole and an electron, which are injected into the organic light emitting layer OEL, are recombined with each other to generate an exciton. The light emitting element OLED may emit the light while the exciton is transited to a ground state.

Figure 3:
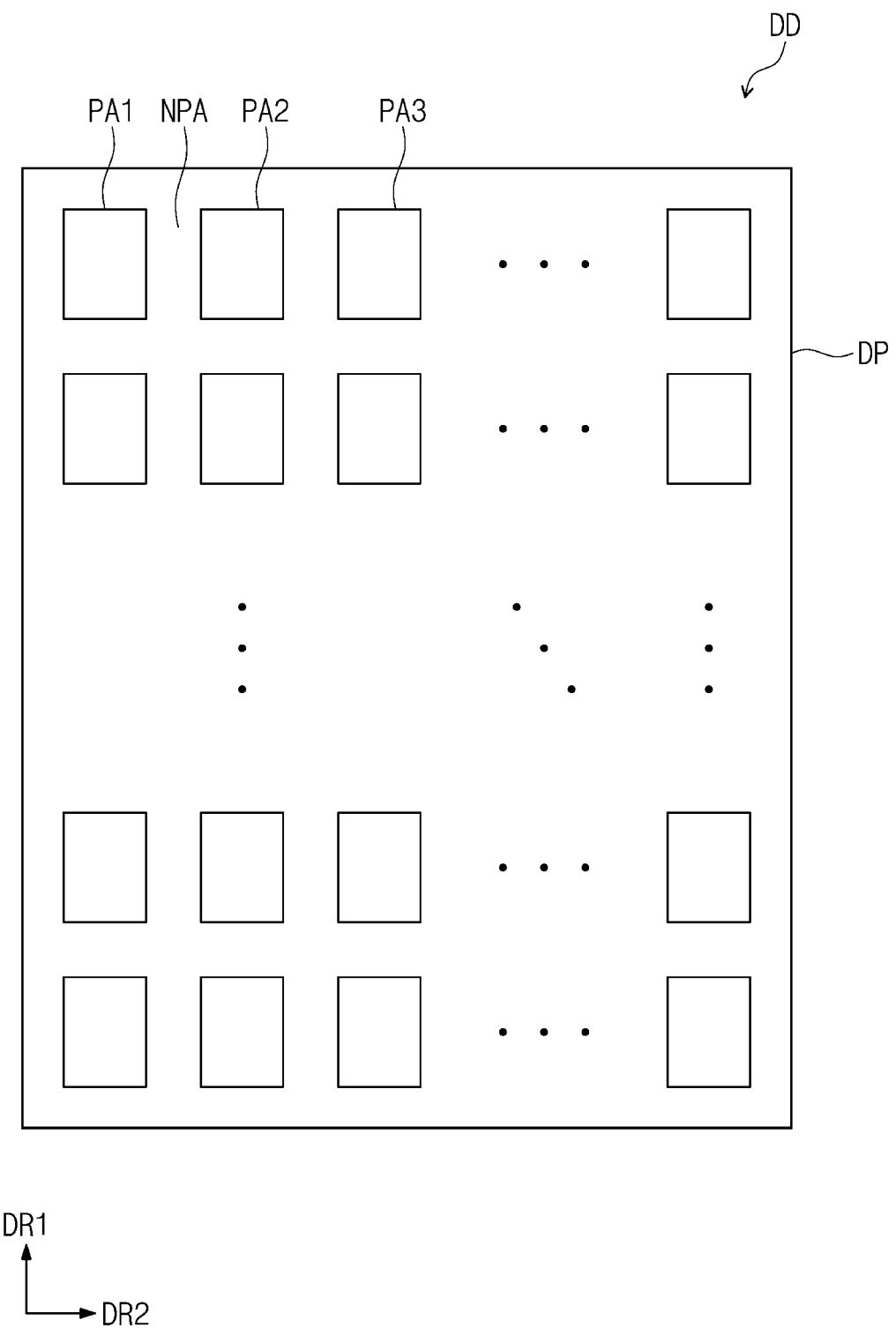
FIG. 3 is a plan view showing a pixel area and a non-pixel area shown in FIG. 2 and defined in a display panel of the display device shown in FIG. 1.

FIG. 3 is a plan view showing the pixel area PA and the non-pixel area NPA shown in FIG. 2 and defined in the display panel DP of the display device DD shown in FIG. 1.

Referring to FIG. 3, the display panel DP may include a plurality of pixel areas PA1, PA2, and PA3 and the non-pixel area NPA around each of the pixel areas PA1, PA2, and PA3. The non-pixel area NPA may be an area between the pixel areas PA1, PA2, and PA3. The pixel area PA shown in FIG. 2 may be one of the pixel areas PA1, PA2, and PA3 shown in FIG. 3.

In an embodiment, the pixel areas PA1, PA2, and PA3 may be arranged in a matrix form; however embodiments of the present disclosure are not limited thereto or thereby. In an embodiment, each of the pixel areas PA1, PA2, and PA3 may have a rectangular shape with long sides in the first direction DR1 and short sides in the second direction DR2. However, each of the pixel areas PA1, PA2, and PA3 are not limited to the rectangular shape and may have any of a variety of shapes.

The pixel areas PA1, PA2, and PA3 may include a plurality of first pixel areas PA1, a plurality of second pixel areas PA2, and a plurality of third pixel areas PA3. In an embodiment, the first, second, and third pixel areas PA1, PA2, and PA3 may be sequentially arranged in the second direction DR2.

Figure 4:
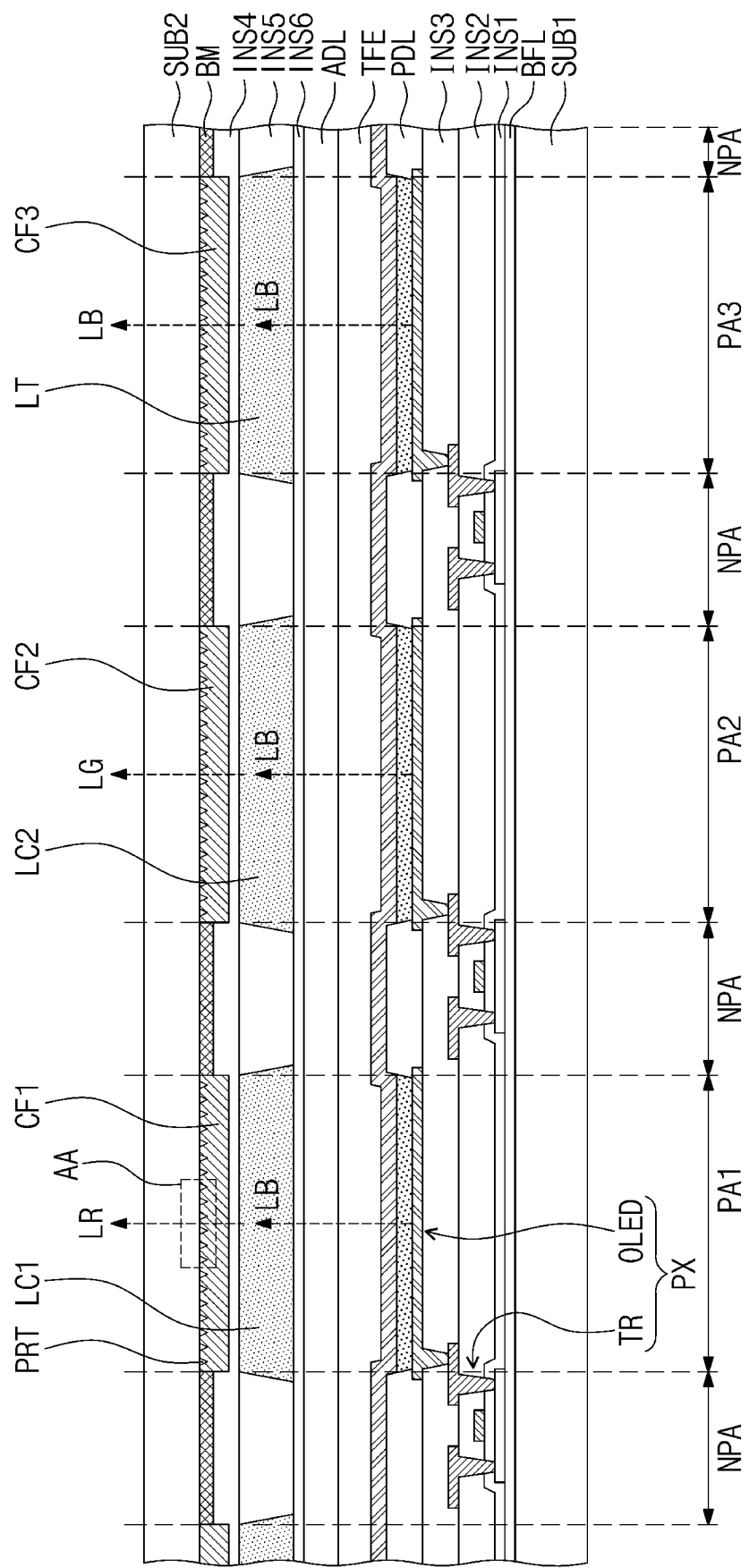
FIG. 4 is a cross-sectional view showing a display panel in which first, second, and third pixel areas shown in FIG. 3 are arranged.

FIG. 4 is a cross-sectional view showing the display panel DP in which the first, second, and third pixel areas PA1, PA2, and PA3 shown in FIG. 3 are arranged.

For the convenience of explanation, FIG. 4 shows a cross-section of the display panel DP in which the first pixel area PA1, the second pixel area PA2, and the third pixel area PA3 adjacent to each other are arranged.

Referring to FIG. 4, the display panel DP may include the first substrate SUB1, a second substrate SUB2, the pixels PX, a plurality of color filters CF1, CF2, and CF3, a black matrix BM, a plurality of light conversion layers LC1, LC2, and LT, an adhesive layer ADL, and a plurality of protrusions PRT.

The second substrate SUB2 may be disposed above the first substrate SUB1 to face the first substrate SUB1. The pixels PX may be disposed between the first substrate SUB1 and the second substrate SUB2. Since a configuration of the pixels PX is described with reference to FIG. 2, further details thereof will be omitted. In an embodiment, the second substrate SUB2 may be a transparent insulating substrate made of glass or plastic.

Herein, the expressions "overlapping with the pixel areas PA1, PA2, and PA3" and "overlapping with the non-pixel area NPA" may indicate components overlapping with the pixel areas PA1, PA2, and PA3 and components overlapping the non-pixel area NPA when viewed in a plane. Here, the plane may indicate a plane defined by the first and second directions DR1 and DR2.

The color filters CF1, CF2, and CF3 and the black matrix BM may be disposed between the pixels PX and the second substrate SUB2, and the light conversion layers LC1, LC2, and LT may be disposed between the pixels PX and the color filters CF1, CF2, and CF3. The black matrix BM may be disposed between the color filters CF1, CF2, and CF3.

The color filters CF1, CF2, and CF3 and the light conversion layers LC1, LC2, and LT may overlap with the first, second, and third pixel areas PA1, PA2, and PA3, and the black matrix BM may overlap with the non-pixel area NPA. The color filters CF1, CF2, and CF3 and the black matrix BM may be disposed on a lower surface of the second substrate SUB2 facing the first substrate SUB1.

The light conversion layers LC1, LC2, and LT may include a first light conversion layer LC1 overlapping with the first pixel area PA1, a second light conversion layer LC2 overlapping with the second pixel area PA2, and a light transmission layer LT overlapping with the third pixel area PA3. The first light conversion layer LC1 may include first quantum dots (not shown), and the second light conversion layer LC2 may include second quantum dots (not shown). The light transmission layer LT may include light scattering particles (not shown).

The first quantum dots may convert a light in a blue wavelength band to a light in a red wavelength band. The second quantum dots may convert the light in the blue wavelength band to a light in a green wavelength band. The first and second quantum dots may scatter the light. The light transmission layer LT may scatter the light using the light scattering particles without performing a light conversion operation.

The color filters CF1, CF2, and CF3 may be disposed between the second substrate SUB2 and the light conversion layers LC1, LC2, and LT. In an embodiment, the color filters CF1, CF2, and CF3 may have a refractive index smaller than that of the first, second, and third light conversion layers LC1, LC2, and LT. The color filters CF1, CF2, and CF3 may include a first color filter CF1 disposed on the first light conversion layer LC1, a second color filter CF2 disposed on the second light conversion layer LC2, and a third color filter CF3 disposed on the light transmission layer LT.

The first color filter CF1 may include a red color filter, the second color filter CF2 may include a green color filter, and the third color filter CF3 may include a blue color filter. However, embodiments of the present disclosure are not limited thereto or thereby, and, in an embodiment, the third color filter CF3 may include a transparent color filter. In an embodiment, when the third color filter CF3 is transparent, the light transmission layer LT and the third color filter CF3 may be integrally formed with each other.

A fourth insulating layer INS4 may be disposed under the first, second, and third color filters CF1, CF2, and CF3 and the black matrix BM. The fourth insulating layer INS4 may be referred to as a "low refractive index layer" and may have a refractive index less than that of the light conversion layers LC1, LC2, and LT.

The first, second, and third light conversion layers LC1, LC2, and LT and a fifth insulating layer INS5 may be disposed under the fourth insulating layer INS4. The fifth insulating layer INS5 may be disposed between the light conversion layers LC1, LC2, and LT and may overlap with the non-pixel area NPA. The fifth insulating layer INS5 may be referred to as a "barrier insulating layer."

A sixth insulating layer INS6 may be disposed under the first, second, and third light conversion layers LC1, LC2, and LT and the fifth insulating layer INS5, and the thin film encapsulation layer TFE may be disposed under the sixth insulating layer INS6. The adhesive layer ADL may be disposed between the sixth insulating layer INS6 and the thin film encapsulation layer TFE. The thin film encapsulation layer TFE may be attached to the sixth insulating layer INS6 by the adhesive layer ADL.

The protrusions PRT may be disposed between the first, second, and third color filters CF1, CF2, and CF3 and the second substrate SUB2. The protrusions PRT may overlap with the first, second, and third pixel areas PA1, PA2, and PA3. Configurations of the protrusions PRT will be described in further detail with reference to FIG. 5.

The light emitting elements OLED of the first, second, and third pixel areas PA1, PA2, and PA3 may generate a first light LB having a blue color. The first light LB generated from the light emitting element OLED of the first pixel area PA1 may be provided to the first light conversion layer LC1. The first light LB generated from the light emitting element OLED of the second pixel area PA2 may be provided to the second light conversion layer LC2. The first light LB generated from the light emitting element OLED of the third pixel area PA3 may be provided to the light transmission layer LT.

The first quantum dots of the first light conversion layer LC1 may convert the first light LB to a second light LR. For example, the first quantum dots may convert the blue wavelength of the first light LB to the red wavelength and, thus, may generate the second light LR having the red wavelength.

A portion of the first light LB may transmit through the first light conversion layer LC1 without making contact with the first quantum dots and may be provided to the first color filter CF1. That is, the first light LB that does not make contact with the first quantum dots and is not converted to the second light LR may exist. The first light LB that is not converted while transmitting through the first light conversion layer LC1 may be converted to the second light LR having the red color by the first color filter CF1 and may be emitted upward.

The second quantum dots of the second light conversion layer LC2 may convert the first light LB to a third light LG. For example, the second quantum dots may convert the blue wavelength of the first light LB to the green wavelength and, thus, may generate the third light LG having the green wavelength.

A portion of the first light LB may transmit through the second light conversion layer LC2 without making contact with the second quantum dots and may be provided to the second color filter CF2. That is, the first light LB that does not make contact with the second quantum dots and is not converted to the third light LG may exist. The first light LB that is not converted while transmitting through the second light conversion layer LC2 may be converted to the third light LG having the green color by the second color filter CF2 and may be emitted upward.

The first light LB provided to the light transmission layer LT may be emitted upward after passing through the light transmission layer LT and the third color filter CF3. Accordingly, the red, green, and blue lights may exit through the display panel DP, and, thus, the image may be displayed. The black matrix BM may block unnecessary lights in the non-pixel area NPA.

Figure 5:
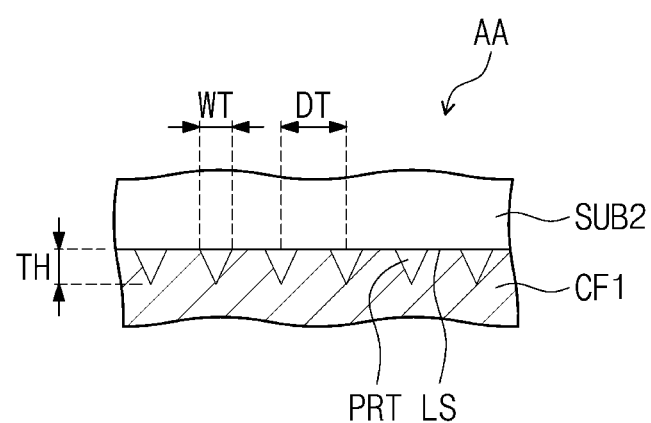
FIG. 5 is an enlarged view showing a region "AA" shown in FIG. 4.
Figure 6:
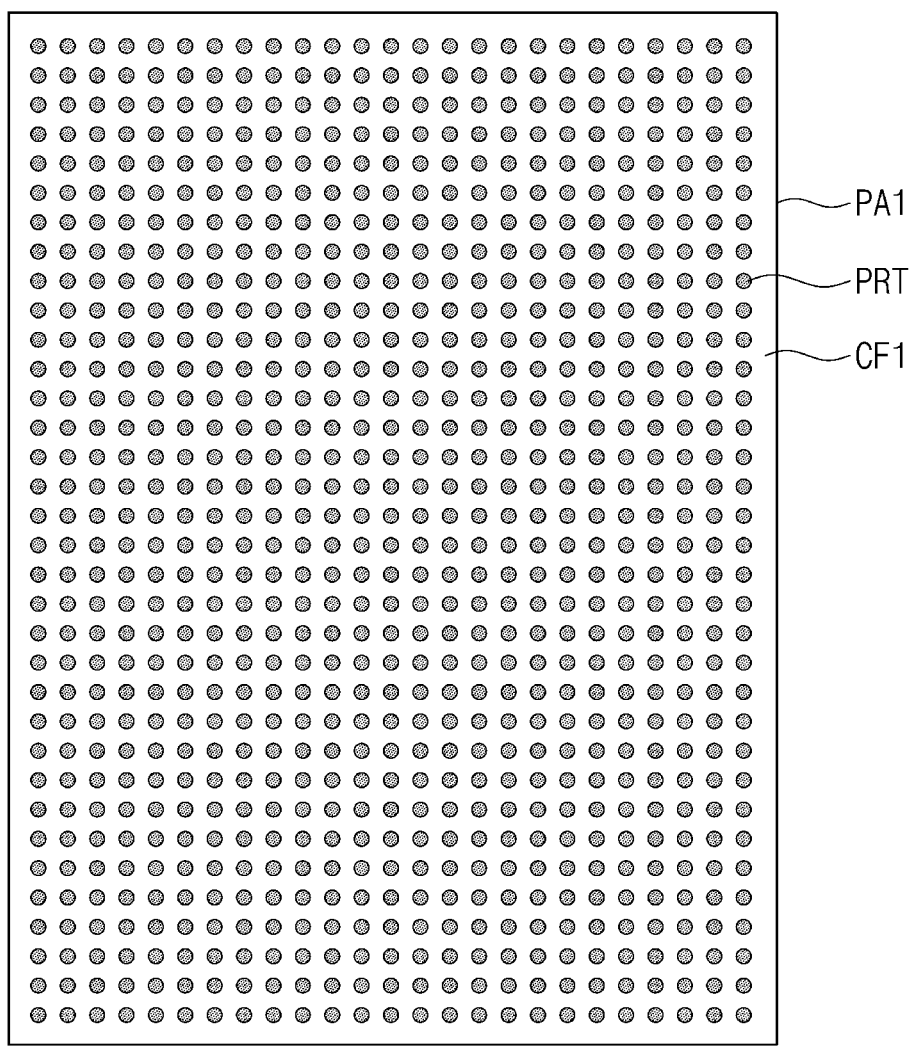
Figure 7:
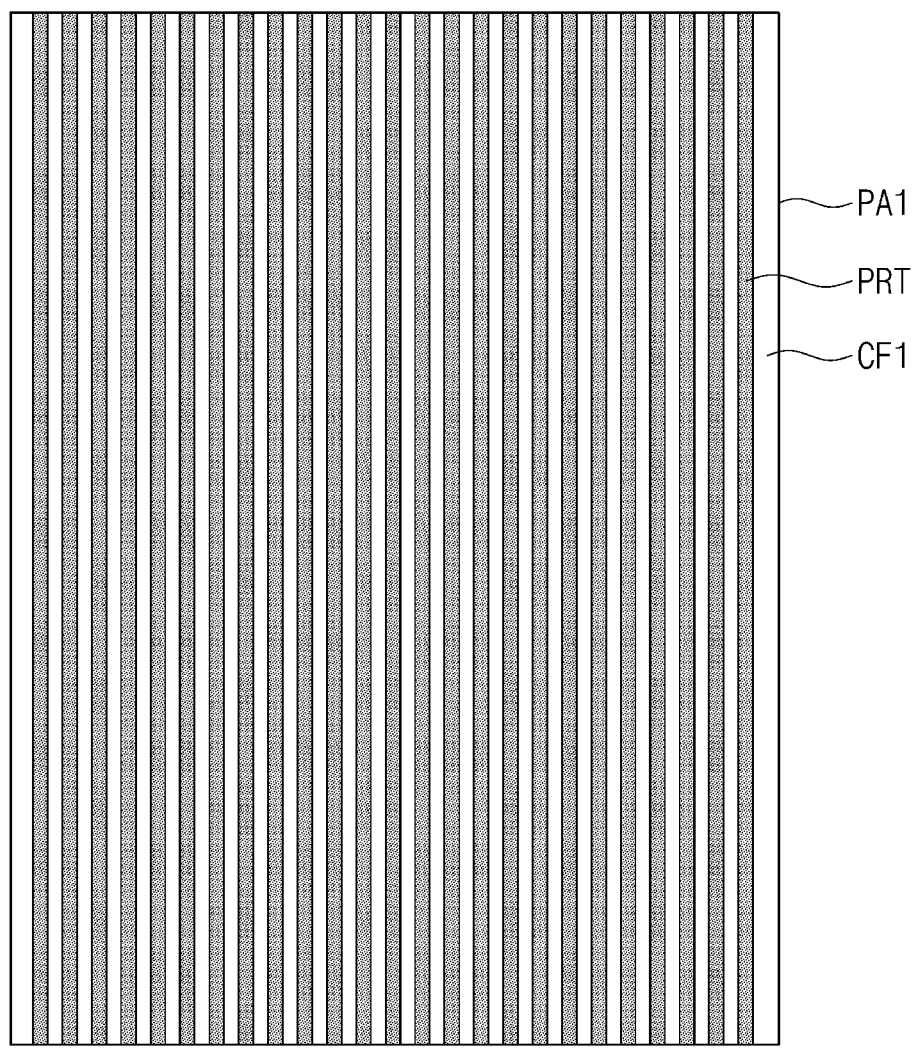

FIG. 5 is an enlarged view showing a region "AA" shown in FIG. 4. FIGS. 6, 7, and 8 are views showing various arrangements of protrusions shown in FIG. 4.

FIG. 5 is a view illustrating a configuration of the protrusions PRT shown in FIG. 4; and FIGS. 6, 7, and 8 are views showing various arrangements of the protrusions PRT disposed in the first color filter CF1 overlapping with the first pixel area PA1 of FIG. 4.

In an embodiment, the protrusions PRT disposed between each of the first, second, and third color filters CF1, CF2, and CF3 and the second substrate SUB2 have substantially a same structure as each other. Therefore, the protrusions PRT disposed between the first color filter CF1 and the second substrate SUB2 will be described as a representative example, and further descriptions of the protrusions PRT disposed between each of the second and third color filters CF2 and CF3 and the second substrate SUB2 will be omitted.

Referring to FIG. 5, the protrusions PRT may be disposed between the first color filter CF1 and the second substrate SUB2. The protrusions PRT may be disposed on the lower surface of the second substrate SUB2 and may protrude downward from the second substrate SUB2. The first color filter CF1 may be disposed on the lower surface of the second substrate SUB2 to cover the protrusions PRT. Herein, the term "width" may mean a size of a component measured in a horizontal direction.

A width of an upper end of each of the protrusions PRT facing the second substrate SUB2 may be greater than a width of a lower end of each of the protrusions PRT. In further detail, the width of each of the protrusions PRT may decrease as a distance from the second substrate SUB2 increases. As an example, each of the protrusions PRT may have an inverted triangular shape. However, the protrusions PRT may have any of a variety of shapes in which the width of each of the protrusions PRT decreases as the distance from the second substrate SUB2 increases.

Referring to FIGS. 6, 7, and 8, the protrusions PRT may be arranged in any of various arrangements when viewed in a plan view. As shown in FIG. 6, the protrusions PRT may be arranged in the first direction DR1 and the second direction DR2 to be spaced apart from each other. That is, in an embodiment, the protrusions PRT may be arranged in a matrix form.

However, the arrangement of the protrusions PRT according to embodiments of the present disclosure is not limited thereto or thereby, and the protrusions PRT may extend in the first direction DR1 and may be arranged in the second direction DR2. In an embodiment, the protrusions PRT may extend in the second direction DR2 and may be arranged in the first direction DR1, as shown in FIG. 8. That is, the protrusions PRT may be arranged in a stripe form.

The protrusions PRT arranged in the matrix and stripe forms are shown in FIGS. 6 to 8; however, in an embodiment, the protrusions PRT may be randomly arranged.

Referring to FIG. 5, the protrusions PRT may be disposed to be spaced apart from each other; however, embodiments of the present disclosure are not limited thereto or thereby. That is, the protrusions PRT may be arranged such that edges of upper surfaces of two protrusions PRT adjacent to each other make contact with each other. The upper surfaces of the protrusions PRT may correspond to surfaces of the protrusions PRT which face a lower surface LS of the second substrate SUB2. In addition, the upper surfaces of the protrusions PRT may be defined as the upper ends of the protrusions PRT.

In an embodiment, a width WT of the upper surface of each of the protrusions PRT may be within a range from about 100 nm to about 200 nm. The lower surface LS of the second substrate SUB2 and the upper surface of each of the protrusions PRT may substantially have a plane defined by the first and second directions DR1 and DR2.

In an embodiment, a distance TH between the upper end and the lower end of each of the protrusions PRT with respect to a direction substantially perpendicular to the lower surface LS of the second substrate SUB2 may be within a range from about 200 nm to about 500 nm. The distance TH between the upper end and the lower end of each of the protrusions PRT may be defined as a thickness TH of each of the protrusions PRT. In an embodiment, among the protrusions PRT, a distance DT between a center portion of a h-th protrusion PRT and a (h+1)th protrusion PRT may be within a range from about 200 nm to about 500 nm, where "h" is a natural number.

In an embodiment, the protrusions PRT may include an organic material. In an embodiment, each of the protrusions PRT may have a refractive index from about 1.45 to about 1.55, and, in an embodiment, the refractive index of each of the protrusions PRT may be substantially the same as that of the second substrate SUB2. In an embodiment, the refractive index of each of the protrusions PRT may be less than a refractive index of the first color filter CF1.

Figure 9:
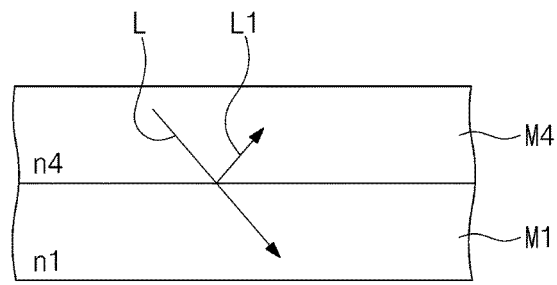
FIGS. 9 to 11 are views showing light reflected at boundaries between a plurality of media.
Figure 10:
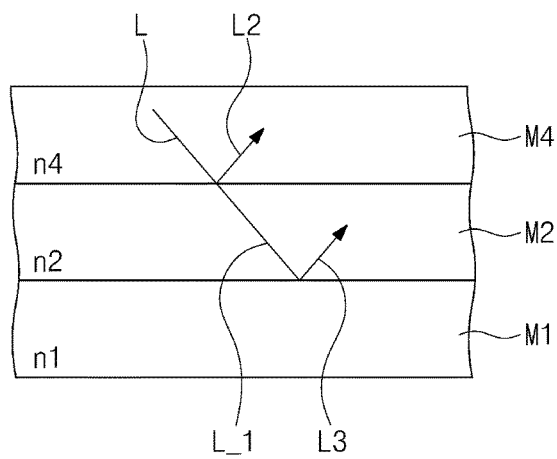
Figure 11:
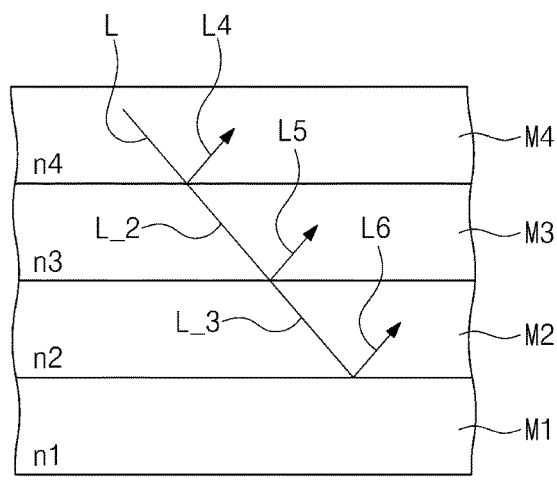
Figure 12:
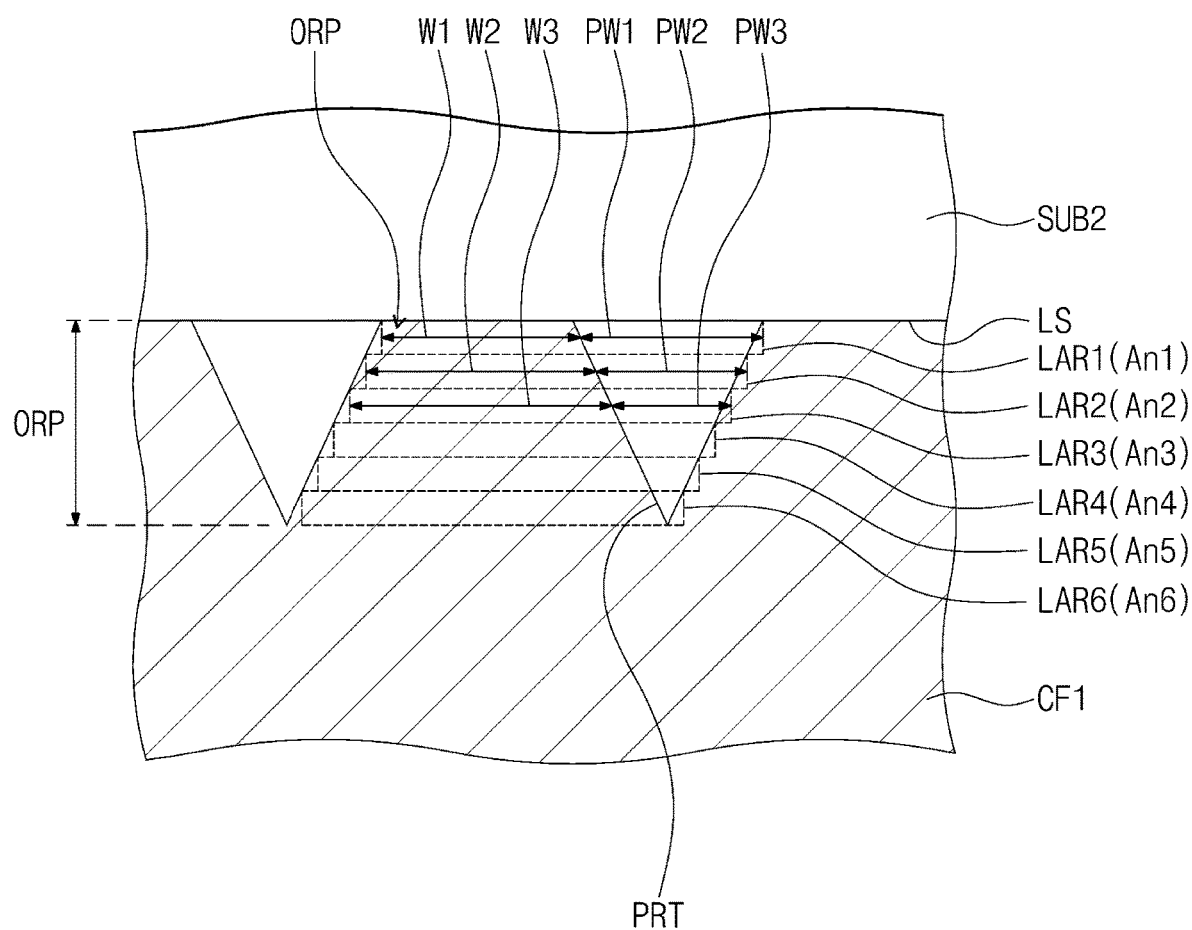
FIG. 12 is a view illustrating a function of protrusions.

FIGS. 9 to 11 are views showing light reflected at boundaries between a plurality of media; and FIG. 12 is a view illustrating a function of protrusions.

FIGS. 9 to 12 are views illustrating effects of the protrusions PRT in accordance with embodiments of the present disclosure. For the convenience of explanation, the refraction of the lights at the boundaries of media M1 to M4 is omitted, and the reflection of the lights at the boundaries of the media M1 to M4 is shown. FIG. 12 is an enlarged view showing some protrusions PRT disposed in the first color filter CF1.

Referring to FIG. 9, a fourth medium M4 may be disposed on a first medium M1. The first medium M1 has a first refractive index n1, and the fourth medium M4 has a fourth refractive index n4 different from the first refractive index n1. As an example, the first refractive index n1 may be larger than the fourth refractive index n4; however, embodiments of the present disclosure are not limited thereto or thereby. That is, the first refractive index n1 may be smaller than the fourth refractive index n4 according to one or more embodiments.

When refractive indices between media are different from each other, a portion of the lights may be reflected at the boundaries between the media. An amount of the light reflected at the boundaries between the media may increase as a difference in refractive index between the media increases. Since the fourth refractive index n4 and the first refractive index n1 are different from each other, a light L1 that is a portion of a light L traveling to the first medium M1 from the fourth medium M4 may be reflected at the boundary between the fourth medium M4 and the first medium M1. The reflected light L1 may exit to the outside of the fourth medium M4.

Referring to FIG. 10, a second medium M2 may be disposed between the first medium M1 and the fourth medium M4. The second medium M2 may have a second refractive index different from the first refractive index n1 and the fourth refractive index n4.

In an embodiment, the second refractive index n2 may be smaller than the first refractive index n1 and may be larger than the fourth refractive index n4. Accordingly, the refractive indices of the first, second, and fourth media M1, M2, and M4 may increase downward; however, embodiments of the present disclosure are not limited thereto or thereby. As another example, the refractive indices of the first, second, and fourth media M1, M2, and M4 may decrease downward.

In an embodiment, since the second refractive index n2 has a value between the first refractive index n1 and the fourth refractive index n4, a difference between the fourth refractive index n4 and the second refractive index n2 may be smaller than a difference between the fourth refractive index n4 and the first refractive index n1. In addition, a difference between the second refractive index n2 and the first refractive index n1 may be smaller than a difference between the fourth refractive index n4 and the first refractive index n1.

Since the fourth refractive index n4 and the second refractive index n2 are different from each other, a light L2 that is a portion of a light L traveling to the second medium M2 from the fourth medium M4 may be reflected at the boundary between the fourth medium M4 and the second medium M2. Since the second refractive index n2 and the first refractive index n1 are different from each other, a light L3 that is a portion of a light L_1 traveling to the first medium M1 from the second medium M2 may be reflected at the boundary between the second medium M2 and the first medium M1.

Since a difference between the fourth refractive index n4 and the second refractive index n2 is smaller than a difference between the fourth refractive index n4 and the first refractive index n1, an amount of the light reflected at the boundary between the fourth medium M4 and the second medium M2 may be smaller than an amount of the light reflected at the boundary between the fourth medium M4 and the first medium M1 shown in FIG. 9.

In an embodiment, since a difference between the second refractive index n2 and the first refractive index n1 is smaller than a difference between the fourth refractive index n4 and the first refractive index n1, an amount of the light reflected at the boundary between the second medium M2 and the first medium M1 may be smaller than an amount of the light reflected at the boundary between the fourth medium M4 and the first medium M1 shown in FIG. 9. Although not shown in figures, a portion of the light L3 may travel downward again after being reflected at the boundary between the fourth medium M4 and the second medium M2.

Accordingly, an amount of the light exiting to the outside of the fourth medium M4 after being reflected at the boundaries between the first, second, and fourth media M1, M2, and M4 shown in FIG. 10 may be smaller than the amount of the light exiting to the outside of the fourth medium M4 after being reflected at the boundary between the first and fourth media M1 and M4 shown in FIG. 9.

Referring to FIG. 11, the second medium M2 and a third medium M3 may be disposed between the first medium M1 and the fourth medium M4, and the third medium M3 may be disposed between the second medium M2 and the fourth medium M4. The third medium M3 may have a third refractive index n3 different from the first, second, and fourth refractive indices n1, n2, and n4.

In an embodiment, the third refractive index n3 may be smaller than the second refractive index n2 and may be larger than the fourth refractive index n4. Accordingly, the refractive indices of the first, second, third, and fourth media M1, M2, M3, and M4 may increase downward; however, embodiments of the present disclosure are not limited thereto or thereby. As another example, the refractive indices of the first, second, third, and fourth media M1, M2, M3, and M4 may decrease downward.

In an embodiment, since the third refractive index n3 has a value between the second refractive index n2 and the fourth refractive index n4, a difference between the fourth refractive index n4 and the third refractive index n3 may be smaller than a difference between the fourth refractive index n4 and the second refractive index n2. In addition, a difference between the third refractive index n3 and the second refractive index n2 may be smaller than a difference between the fourth refractive index n4 and the second refractive index n2.

Since the first, second, third, and fourth refractive indices n1, n2, n3, and n4 are different from each other, a light L4 that is a portion of a light L traveling to the third medium M3 from the fourth medium M4 may be reflected at the boundary between the fourth medium M4 and the third medium M3. In addition, a light L5 that is a portion of a light L_2 traveling to the second medium M2 from the third medium M3 may be reflected at the boundary between the third medium M3 and the second medium M2. A light L6 that is a portion of a light L_3 traveling to the first medium M1 from the second medium M2 may be reflected at the boundary between the second medium M2 and the first medium M1.

An amount of the light reflected at the boundary between the fourth medium M4 and the third medium M3 may be smaller than the amount of the light reflected at the boundary between the fourth medium M4 and the second medium M2 shown in FIG. 10. In addition, an amount of the light reflected at the boundary between the third medium M3 and the second medium M2 may be smaller than the amount of the light reflected at the boundary between the fourth medium M4 and the second medium M2 shown in FIG. 10. Although not shown in figures, a portion of the light L5 may travel downward again after being reflected at the boundary between the fourth medium M4 and the third medium M3.

Accordingly, an amount of the light exiting to the outside of the fourth medium M4 after being reflected at the boundaries between the first, second, third, and fourth media M1, M2, M3, and M4 shown in FIG. 11 may be smaller than the amount of the light exiting to the outside of the fourth medium M4 after being reflected at the boundary between the first, second, and fourth media M1, M2, and M4 shown in FIG. 10.

In a case in which the number of the media stacked between the first medium M1 and the fourth medium M4 is increased and the refractive indices of the media gradually increase downward, a difference in refractive index between the media may be decreased.

That is, since a reflectivity increases as the difference between the refractive indices increases, the amount of the light reflected at the boundaries between the media may decrease by increasing the number of the media to decrease the difference between the refractive indices. As an example, the embodiment in which the refractive indices increase downward has been described. However, on the contrary, although the refractive indices increase downward, the difference between the refractive indices may decrease, and thus the amount of the light reflected at the boundaries between the media.

Referring to FIG. 12, the protrusion PRT and an overlap portion ORP of the first color filter CF1, which overlaps with the protrusion PRT in a horizontal direction, may be divided into a plurality of arbitrary layers LAR1 to LAR6. As an example, the protrusion PRT and the overlap portion ORP may be divided into six layers LAR1 to LAR6; however, they may be divided into a different number of layers (e.g., more layers). In an embodiment, the protrusion PRT may have a refractive index smaller than that of the overlap portion ORP.

In a first layer LAR1, the overlap portion ORP may have a first width W1, and the protrusion PRT may have a second width PW1. An average refractive index of the overlap portion ORP and the protrusion PRT in the first layer LAR1 may be a first average refractive index An1. The average refractive index may correspond to a value obtained by adding a value, which is obtained by multiplying an area of the overlap portion ORP by the refractive index of the overlap portion ORP, and a value, which is obtained by multiplying an area of the protrusion PRT by the refractive index of the protrusion PRT, and by dividing the added value by two, that is, the number of target media (for example, the overlap portion ORP and the protrusion PRT).

In a second layer LAR2, the overlap portion ORP may have a third width W2 larger than the first width W1, and the protrusion PRT may have a fourth width PW2 smaller than the second width PW1. The width of the protrusion PRT may decrease more in the second layer LAR2 than in the first layer LAR1, and the width of the protrusion ORP may increase more in the second layer LAR2 than in the first layer LAR1. Since the area of the overlap portion ORP having the refractive index larger than the protrusion PRT increases more in the second layer LAR2 than in the first layer LAR1, an average refractive index of the overlap portion ORP and the protrusion PRT in the second layer LAR2 may be a second average refractive index An2 larger than the first average refractive index An1.

In a third layer LAR3, the overlap portion ORP may have a fifth width W3 larger than the third width W2, and the protrusion PRT may have a sixth width PW3 smaller than the fourth width PW2. The width of the protrusion PRT may decrease more in the third layer LAR3 than in the second layer LAR2, and the width of the protrusion ORP may increase more in the third layer LAR3 than in the second layer LAR2. Since the area of the overlap portion ORP having the refractive index larger than the protrusion PRT increases more in the third layer LAR3 than in the second layer LAR2, an average refractive index of the overlap portion ORP and the protrusion PRT in the third layer LAR3 may be a third average refractive index An3 larger than the second average refractive index An2.

According to the area of the overlap portion ORP and the protrusion PRT, an average refractive index of a fourth layer LAR4 may be a fourth average refractive index An4 larger than the third average refractive index An3, and an average refractive index of a fifth layer LAR5 may be a fifth average refractive index An5 larger than the fourth average refractive index An4. In addition, an average refractive index of a sixth layer LAR6 may be a sixth average refractive index An6 larger than the fifth average refractive index An5. The first to sixth average refractive indices An1 to An6 may be defined as refractive indices of the first to sixth layers LAR1 to LAR6.

The six layers LAR1 to LAR6 may have substantially different refractive indices from each other, and the refractive indices An1 to An6 of the six layers LAR1 to LAR6 may gradually increase downward. That is, the refractive indices An1 to An6 of the six layers LAR1 to LAR6 may gradually vary downward.

As described with reference to FIGS. 9 to 11, when the number of the stacked media increases and the refractive indices of the media gradually increase downward, the amount of the light reflected at the boundaries between the media and emitted to the outside may be more reduced.

As described above, the effect that the protrusion PRT and the overlap portion ORP are divided into the average refractive indices of the plural layers may increase as the distance between the protrusions PRT decreases. For example, when the distance between the protrusions PRT adjacent to each other is equal to or smaller than about 500 nm, the above-described effect may occur in the protrusion PRT and the overlap portion ORP. To this end, in an embodiment of the present disclosure, the distance between the protrusions PRT adjacent to each other may be set in a range from about 200 nm to about 500 nm as described above.

The external light may travel to the first color filter CF1 through the second substrate SUB2. Since the reflectivity of the external light decreases while passing through the overlap portion ORP and the protrusion PRT, each of which may be divided into the six layers LAR1 to LAR6, the amount of the light reflected by the overlap portion ORP and the protrusion PRT and emitted to the outside may be reduced. As a representative example, the six layers LAR1 to LAR6 and the average refractive indices An1 to An6 of the six layers LAR1 to LAR6 have been described; however, the overlap portion ORP and the protrusion PRT may be divided into more than six layers.

In a case in which the protrusions PRT are not disposed between the second substrate SUB2 and the color filters CF1, CF2, and CF3, the difference in refractive index between the second substrate SUB2 and the color filters CF1, CF2, and CF3 may be larger than that in which the protrusions PRT are disposed between the second substrate SUB2. In this case, the external light traveling to the second substrate SUB2 from the outside may be reflected at the boundaries between the second substrate SUB2 and the color filters CF1, CF2, and CF3 and may travel again to a user outside the second substrate SUB2. Accordingly, the external light may be perceived by the user.

However, in embodiments of the present disclosure, the protrusions PRT are disposed between the second substrate SUB2 and the color filters CF1, CF2, and CF3, and, thus, the reflectivity of the external light traveling to the color filters CF1, CF2, and CF3 through the second substrate SUB2 may be reduced. As a result, the amount of the light traveling to the user outside the second substrate SUB2 may be reduced, and, thus, the external light may not be perceived by the user.

Figure 13:
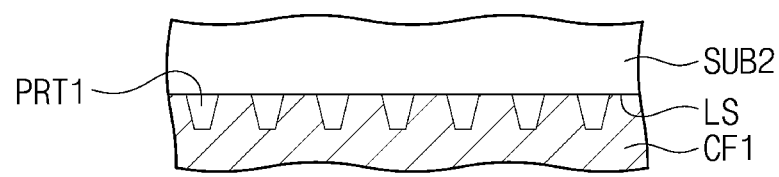
FIGS. 13 to 15 are views showing configurations of protrusions according to various embodiments of the present disclosure.
Figure 14:
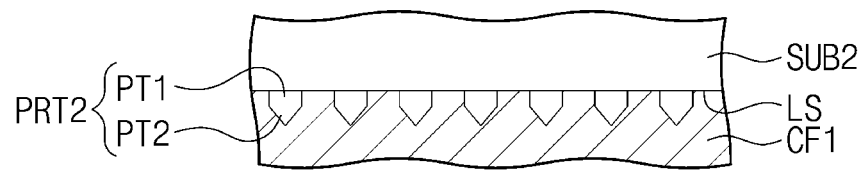
Figure 15:
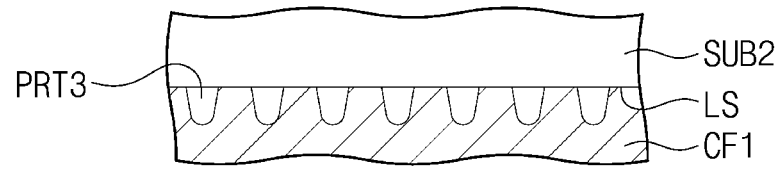

FIGS. 13 to 15 are views showing configurations of protrusions according to various embodiments of the present disclosure.

For the convenience of explanation, FIGS. 13 to 14 show cross-sections corresponding to FIG. 5.

Referring to FIG. 13, a plurality of protrusions PRT1 may be disposed between a second substrate SUB2 and a first color filter CF1. A width of an upper end of each of the protrusions PRT1 may be larger than a width of a lower end of each of the protrusions PRT1, and a width of each of the protrusions PRT1 may decrease downward. For example, the protrusions PRT1 may have an inverted trapezoidal shape.

Referring to FIG. 14, a plurality of protrusions PRT2 may be disposed between a second substrate SUB2 and a first color filter CF1. A width of an upper end of each of the protrusions PRT2 may be larger than a width of a lower end of each of the protrusions PRT2. For example, each of the protrusions PRT2 may include a first portion PT1 having a quadrangular shape and a second portion PT2 elongated downward from a lower portion of the first portion PT1 and having an inverted triangular shape.

Referring to FIG. 15, a plurality of protrusions PRT3 may be disposed between a second substrate SUB2 and a first color filter CF1. A width of an upper end of each of the protrusions PRT3 may be larger than a width of a lower end of each of the protrusions PRT3, and a width of each of the protrusions PRT3 may decrease downward. For example, each of the protrusions PRT3 may have a curved shape that is convex downward.

Although some embodiments of the present invention have been described, it is to be understood that the present invention should not be limited to these embodiments but, rather, various changes and modifications may be made by one of ordinary skill in the art within the spirit and scope of the present invention as herein claimed. Therefore, the disclosed subject matter should not be limited to any single embodiment described herein, and the scope of the present inventive concept shall be determined according to the claims.

What is claimed is:

1. A display device comprising:
   a first substrate;
   a second substrate on the first substrate;
   a pixel between the first substrate and the second substrate and comprising a pixel area and a non-pixel area around the pixel area;
   a color filter between the pixel and the second substrate and overlapping with the pixel area; and
   a plurality of protrusions between the second substrate and the color filter, wherein each of the protrusions has a width that decreases as a distance from the second substrate increases,
   wherein the pixel area is a single light-emitting region extended continuously along a direction from a first portion of the non-pixel area to a second portion of the non-pixel area that is adjacent to the first portion along the direction, and
   wherein the protrusions overlap the single light-emitting region, do not overlap the non-pixel area, and are separated from each other.

2. The display device of claim 1, wherein the protrusions are arranged in a first direction and a second direction crossing the first direction.

3. The display device of claim 1, wherein the color filter is arranged on a lower surface, which faces the first substrate, of the second substrate to cover the protrusions.

4. The display device of claim 3, wherein an upper surface of each of the protrusions facing the lower surface of the second substrate has a width of about 100 nm to about 200 nm.

5. The display device of claim 4, wherein a distance between an upper end and a lower end of each of the protrusions with respect to a direction perpendicular to the lower surface of the second substrate is about 200 nm to about 500 nm.

6. The display device of claim 1, wherein a distance between a center portion of a h-th protrusion among the plurality of protrusions and a center portion of a (h+1)th protrusion among the plurality of protrusions is about 200 nm to about 500 nm, where h is a natural number.

7. The display device of claim 1, wherein each of the protrusions has an inverted triangular shape.

8. The display device of claim 1, wherein each of the protrusions has a refractive index of about 1.45 to about 1.55.

9. The display device of claim 1, wherein each of the protrusions comprises an organic material.

10. The display device of claim 1, wherein each of the protrusions has a same refractive index as the second substrate.

11. The display device of claim 1, wherein each of the protrusions has a refractive index smaller than a refractive index of the color filter.

12. The display device of claim 1, further comprising:
    a light conversion layer between the pixel and the color filter; and
    a black matrix overlapping with the non-pixel area, wherein each of the pixel, the color filter, and the light conversion layer is provided in plural.

13. The display device of claim 12, wherein the pixel area of each of the pixels comprises a light emitting element to generate a first light, and the light conversion layers comprise:
    a first light conversion layer to convert the first light to a second light;
    a second light conversion layer to convert the first light to a third light; and
    a light transmission layer to transmit the first light.

14. The display device of claim 1, wherein the protrusions extend in a first direction and are arranged in a second direction crossing the first direction.

15. The display device of claim 1, wherein each of the protrusions has an inverted trapezoidal shape.

16. The display device of claim 1, wherein each of the protrusions comprises:
    a first portion having a quadrangular shape; and
    a second portion elongated in a direction away from the second substrate from a lower portion of the first portion and having an inverted triangular shape.

17. The display device of claim 1, wherein each of the protrusions has a curved shape that is convex in a direction away from the second substrate.

18. A display device comprising:
    a first substrate;
    a second substrate on the first substrate;
    a pixel between the first substrate and the second substrate and comprising a pixel area and a non-pixel area around the pixel area;
    a color filter between the pixel and the second substrate and overlapping with the pixel area; and
    a plurality of protrusions between the second substrate and the color filter, wherein a width of an upper end of each of the protrusions, which faces the second substrate, is larger than a width of a lower end of each of the protrusions,
    wherein the pixel area is a single light-emitting region extended continuously along a direction from a first portion of the non-pixel area to a second portion of the non-pixel area that is adjacent to the first portion along the direction, and
    wherein the protrusions overlap the single light-emitting region, do not overlap the non-pixel area, and are separated from each other.

19. The display device of claim 18, wherein each of the protrusions has a width that decreases in a direction away from the second substrate.

20. The display device of claim 18, wherein the color filter is arranged on a lower surface, which faces the first substrate, of the second substrate to cover the protrusions.

* * * * *